(12) United States Patent
Chou et al.

(10) Patent No.: US 9,092,204 B2
(45) Date of Patent: Jul. 28, 2015

(54) PORTABLE ELECTRICAL DEVICE WITH HEAT DISSIPATION MECHANISM

(71) Applicant: WISTRON CORP., New Taipei (TW)

(72) Inventors: Wei-Cheng Chou, New Taipei (TW); Ming-Chih Chen, New Taipei (TW); Ai-Tsung Li, New Taipei (TW)

(73) Assignee: Wistron Corp., New Taipei (TW)

( * ) Notice: Subject to any disclaimer, the term of this patent is extended or adjusted under 35 U.S.C. 154(b) by 135 days.

(21) Appl. No.: 14/084,449

(22) Filed: Nov. 19, 2013

(65) Prior Publication Data

US 2015/0018053 A1    Jan. 15, 2015

(30) Foreign Application Priority Data

Jul. 11, 2013 (TW) .............................. 102124857 A

(51) Int. Cl.
*G06F 1/20* (2006.01)
*H04M 1/02* (2006.01)
*H05K 7/20* (2006.01)
*H04M 1/60* (2006.01)

(52) U.S. Cl.
CPC ............. *G06F 1/203* (2013.01); *H04M 1/0202* (2013.01); *H05K 7/20* (2013.01); *H04M 1/6058* (2013.01)

(58) Field of Classification Search
None
See application file for complete search history.

(56) References Cited

U.S. PATENT DOCUMENTS

| 2008/0087329 | A1* | 4/2008 | Chin et al. | 137/338 |
|---|---|---|---|---|
| 2008/0106171 | A1* | 5/2008 | Mongia | 310/334 |
| 2011/0085694 | A1* | 4/2011 | Lee | 381/397 |
| 2011/0216921 | A1* | 9/2011 | Tseng et al. | 381/164 |
| 2013/0312429 | A1* | 11/2013 | Greuet et al. | 62/6 |

* cited by examiner

*Primary Examiner* — Olumide T Ajibade Akonai
*Assistant Examiner* — Margaret G Mastrodonato

(57) ABSTRACT

A portable electrical device with heat dissipation mechanism includes a housing with an acoustic hole, an earphone receptacle with a earphone hole, and two fans. The earphone receptacle and the fans are disposed in the housing. The fans are respectively located adjacent to the acoustic hole and the earphone hole, and generate airflow passing through the acoustic hole and the earphone hole. Thus, the portable electrical device dissipating heat utilizes the holes existing on the housing, without additional heat-dissipation holes.

17 Claims, 10 Drawing Sheets

000# PORTABLE ELECTRICAL DEVICE WITH HEAT DISSIPATION MECHANISM

CROSS-REFERENCE TO RELATED APPLICATIONS

This Application claims priority of Taiwan Patent Application No. 102124857, filed on Jul. 11, 2013, the entirety of which is incorporated by reference herein.

BACKGROUND OF THE INVENTION

1. Field of the Invention

The present disclosure relates to a portable electrical device, and in particular, to a portable electrical device with a heat dissipation mechanism.

2. Description of the Related Art

According to the development trend of portable electrical devices, portable electrical devices such as smartphones with thinner profiles and higher performance are required. Therefore, a number of electronic elements are disposed in a housing of the portable electrical device that has a limited volume. Further, a heat dissipation mechanism is also disposed in the housing to dissipate the great amount of heat that is generated by the electronic elements, and thus additional holes are formed in the housing for dissipating heat.

However, the additional holes in the housing make the appearance of the portable electrical device worse. Further, conventional axial fans or centrifugal fans may not be disposed in a very thin housing.

BRIEF SUMMARY OF THE INVENTION

To solve the described problems, the present disclosure provides a portable electrical device having a heat dissipation mechanism to improve heat-dissipation efficiency.

The present disclosure provides a portable electrical device having a heat dissipation mechanism including a housing, an earphone receptacle, and a first fan. The earphone receptacle is disposed in the housing, and has an earphone hole. The first fan may be a piezoelectric Fan disposed in the housing, adjacent to the earphone hole. When a heat dissipation condition is satisfied and an earphone terminal is not inserted in the earphone receptacle, the first fan is enabled to generate a first airflow passing through the earphone hole.

The present disclosure provides a portable electrical device having a heat dissipation mechanism including a housing, a loudspeaker, and a fan. The housing has an acoustic hole. The loudspeaker is disposed in the housing, adjacent to the acoustic hole. The fan is a piezoelectric fan, disposed in the housing, adjacent to the acoustic hole. When a heat dissipation condition is satisfied, and the loudspeaker is disabled, the fan is enabled to generate an airflow passing through the acoustic hole.

The present disclosure also provides a portable electrical device having a heat dissipation mechanism including a housing and a loudspeaker. The housing has an acoustic hole. The loudspeaker adjacent to the acoustic hole includes an acoustic casing and a vibrating membrane. The acoustic casing is disposed in the housing and has an inlet aperture, an exhaust aperture, and a chamber. The chamber communicates with the inlet aperture and the exhaust aperture. The vibrating membrane is disposed in the acoustic casing, and faces the acoustic hole.

When the heat dissipation condition is satisfied and a central area of the vibrating membrane is moved toward the acoustic hole, the inlet aperture is opened, the exhaust aperture is closed, and an airflow flows into the chamber via the acoustic hole and the inlet aperture. When the heat dissipation condition is satisfied and the central area of the vibrating membrane is moved away from the acoustic hole, the inlet aperture is opened, the exhaust aperture is opened, and a portion of the air in the chamber flows out of the chamber via the exhaust aperture.

In conclusion, the portable electrical device having a heat dissipation mechanism of the present disclosure generates an airflow passing through the acoustic hole and/or the earphone hole by a smaller piezoelectric Fan and/or a vibrating membrane of the loudspeaker to dissipate the heat therein. Moreover, since the portable electrical device dissipates heat via the holes already existing in the housing, additional holes for dissipating heat are not needed.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
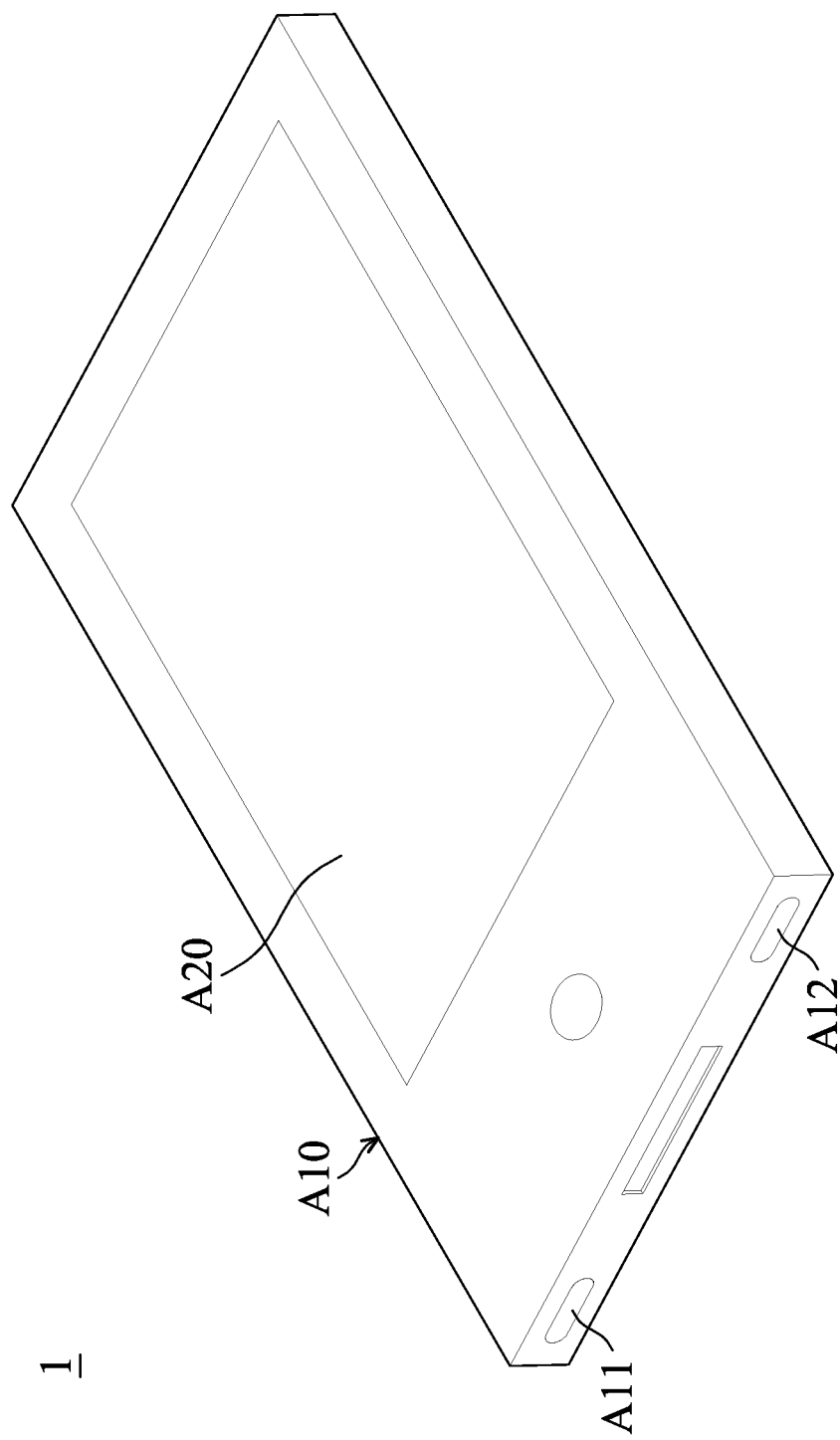
FIGS. 1 and 2 are perspective views of a portable electrical device having a heat dissipation mechanism according to the present disclosure, and in FIG. 2, some elements, such as a display, are omitted for clarity.
Figure 2:
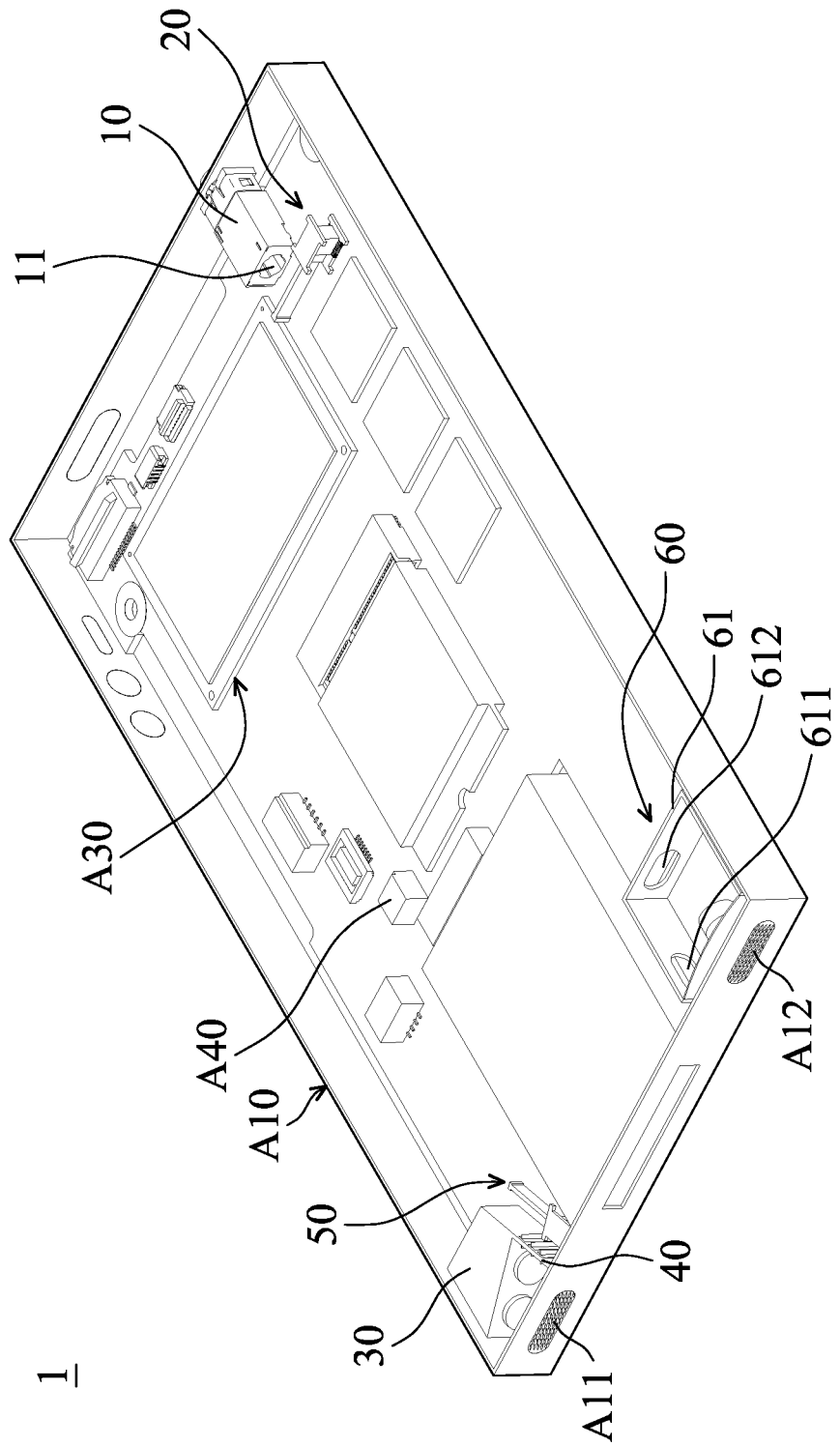
Figure 3:
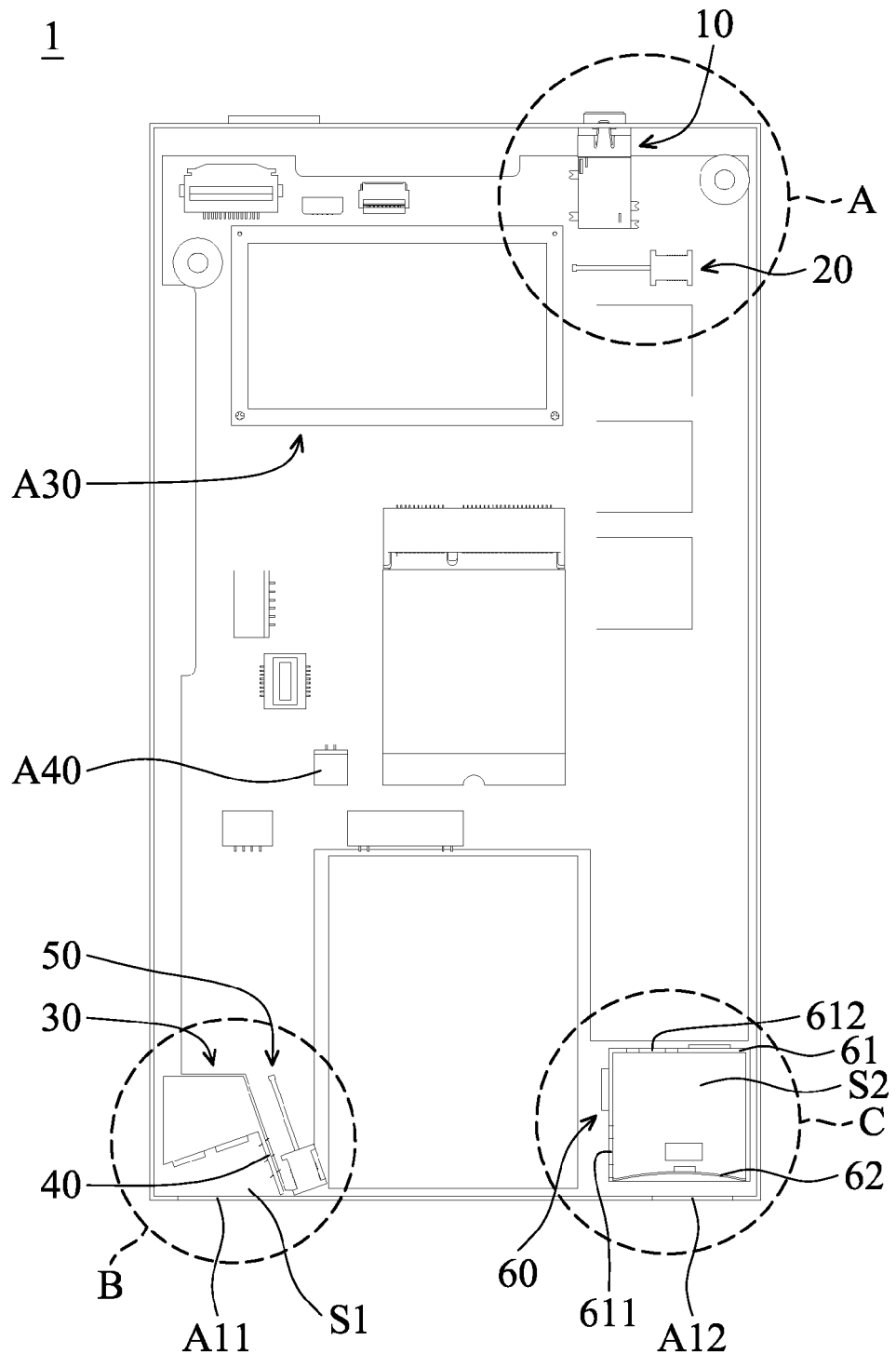
FIG. 3 is a schematic view of a portable electrical device having a heat dissipation mechanism according to the present disclosure, and in FIG. 3, some elements, such as a display, are omitted for clarity.

FIGS. 1 and 2 are perspective views of a portable electrical device 1 having a heat dissipation mechanism according to the present disclosure. FIG. 3 is a schematic view of a portable electrical device 1 having a heat dissipation mechanism according to the present disclosure. In FIGS. 2 and 3, some elements, such as a display A20, are omitted for clarity. The portable electrical device 1 may be a smartphone. The portable electrical device 1 includes a housing A10, a display A20, a plurality of electronic elements A30, and a temperature sensing module A40. The display A20 is disposed on an outer surface of the housing A10. The electronic element A30 is disposed in the housing A10. The electronic element A30 may be a backlight module of the display A20, a processing chip, or a central processing unit (CPU). The electronic element A30 generates heat when the electronic element A30 is enabled.

The temperature sensing module A40 may be a temperature sensor disposed in the housing A10, or integrated with the electronic element A30. The temperature sensing module A40 is able to detect the temperature of the electronic element A30 or the inner side of the housing A10.

Figure 4:
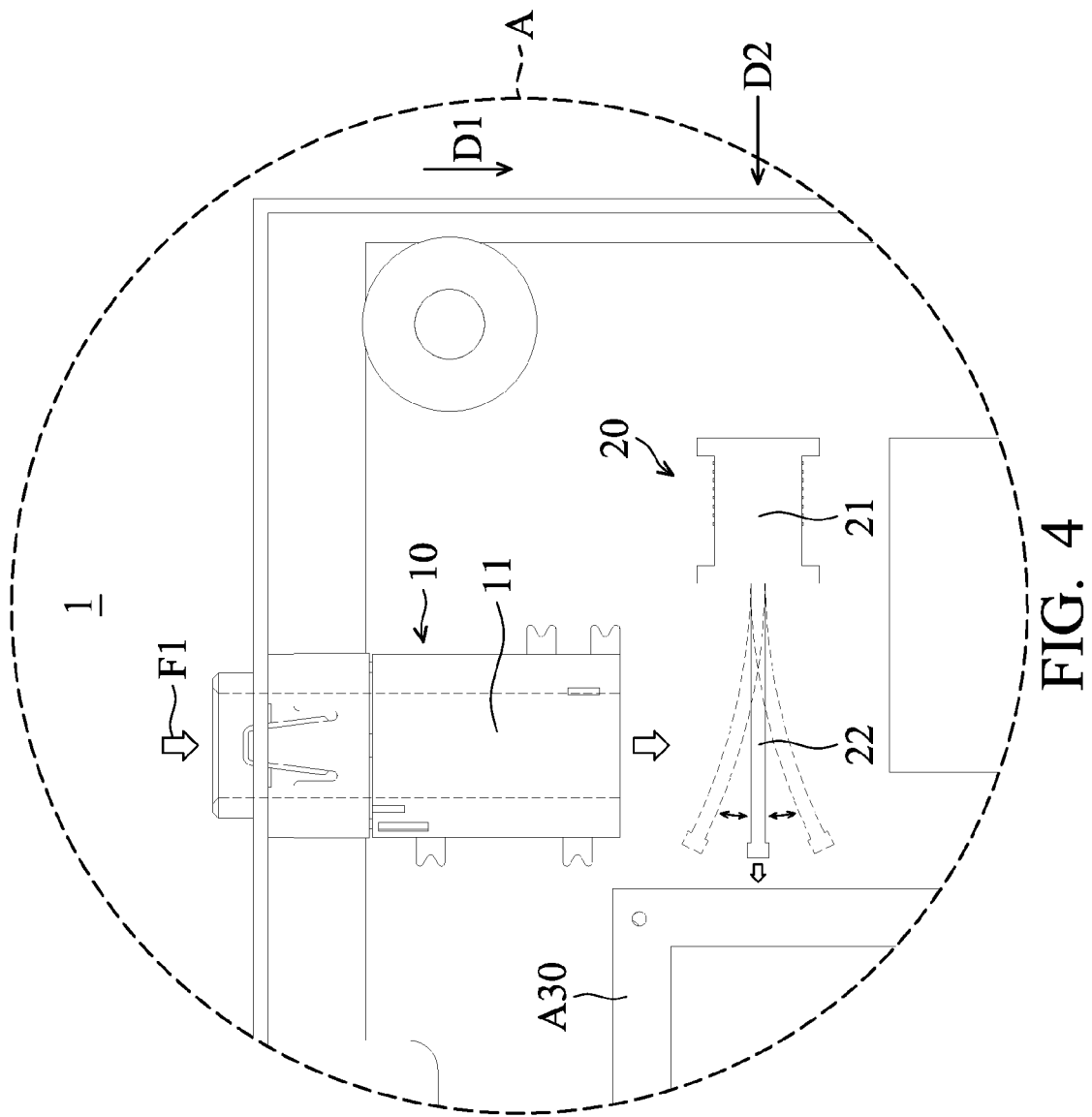
FIG. 4 is an enlarged view of part A of FIG. 3.

FIG. 4 is an enlarged view of part A of FIG. 3. In a first embodiment, the portable electrical device 1 further includes an earphone receptacle 10 and a fan 20. The earphone receptacle 10 is disposed in the housing A10, and has an earphone hole 11 extending along a first direction D1.

The fan 20 is disposed in the housing A10, adjacent to the earphone hole 11. The fan 20 may be a piezoelectric fan including a piezoelectric element 21 and a blade 22. The blade 22 is disposed on the piezoelectric element 21. The blade 22 may be made from piezoelectric material extending along a second direction D2. The first direction D1 is substantially perpendicular to the second direction D2. When the piezoelectric element 21 is enabled, the blade 22 bends and swings. By the swinging of the blade 22, an airflow F1 is generated. Further. By the relative position of the earphone hole 11 and the blade 22 as shown in FIG. 4, a greater airflow F1 is provided. The airflow F1 flows into the housing A10 via the earphone hole 11 along the first direction D1, and then flows to the blade 22. After the airflow F1 flows to the blade 22, the airflow F1 flows to the electronic element A30 substantially along the second direction D2 to dissipating the heat of the electronic element A30.

Figure 5:
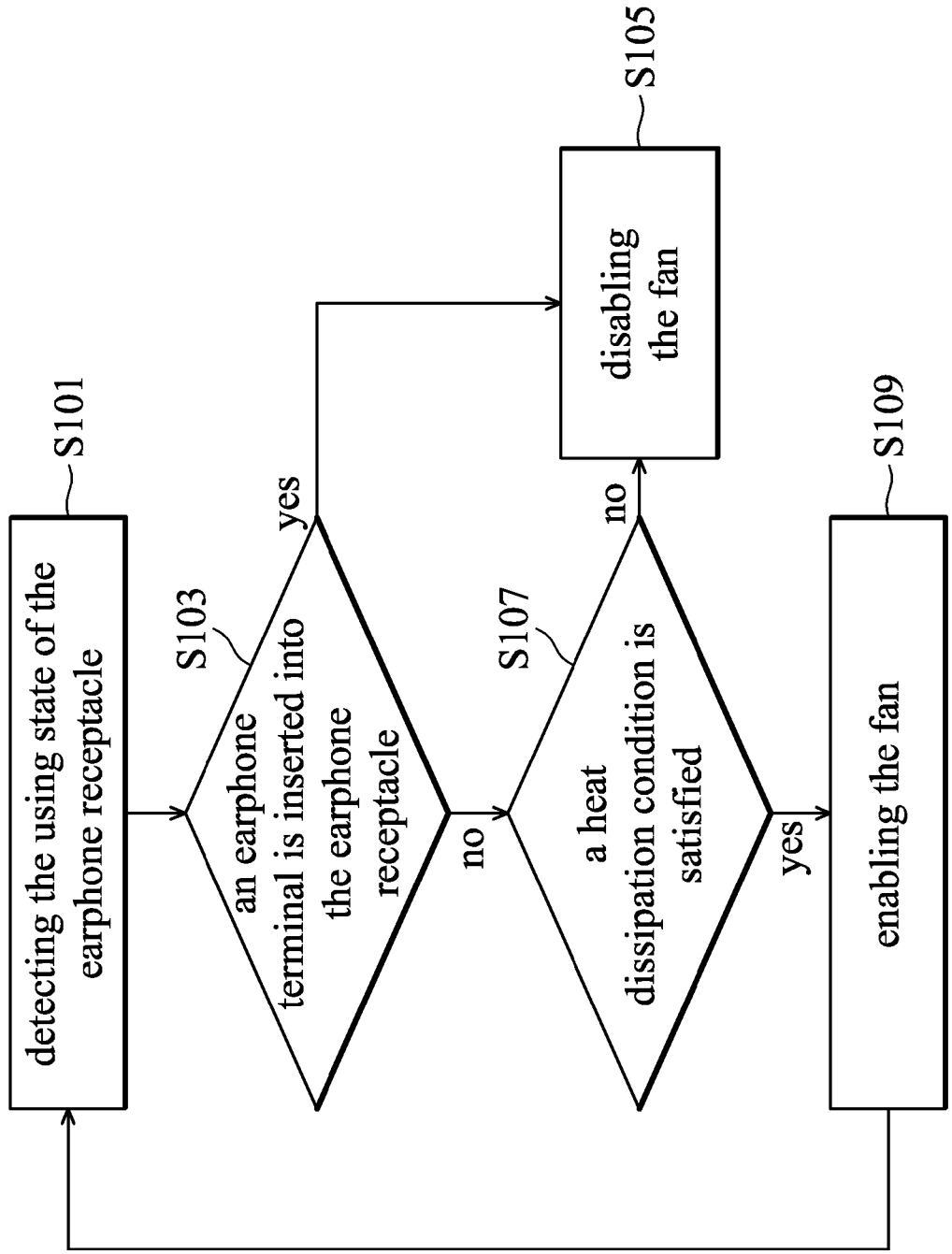
FIG. 5 is a flow chart of a heat dissipation method of the portable electrical device of a first case according to the present disclosure.

FIG. 5 is a flow chart of a heat dissipation method of the portable electrical device 1 of a first case according to the present disclosure. When the heat dissipation method of the first case is processed, the usage state of the earphone receptacle 10 is detected (step S101) to determine whether an earphone terminal (not shown) is inserted into the earphone receptacle 10. Namely, whether the earphone hole 11 is being blocked is determined (step S103). When an earphone terminal is inserted in the earphone receptacle 10, the fan 20 is disabled (step S105).

When an earphone terminal is not inserted in the earphone receptacle 10, whether a heat dissipation condition is satisfied is determined (step S107). In this case, the heat dissipation condition is defined as the temperature sensed by the temperature sensing module A40 being higher than a predetermined temperature. For example, the predetermined temperature may be 60 degrees or 70 degrees. When the heat dissipation condition is not satisfied, the fan 20 is disabled (step S105). When the heat dissipation condition is satisfied, the fan 20 is enabled (step S109). In step S107, the airflow F1 is generated since the fan 20 is enabled.

In another case, the heat dissipation condition is defined as the portable electrical device 1 being in a high loading state. For example, the loading of the CPU of the portable electrical device 1 is at least 80%. Further, when the heat dissipation condition is not satisfied, the portable electrical device 1 may be in a shutdown state or a standby state.

Figure 6:
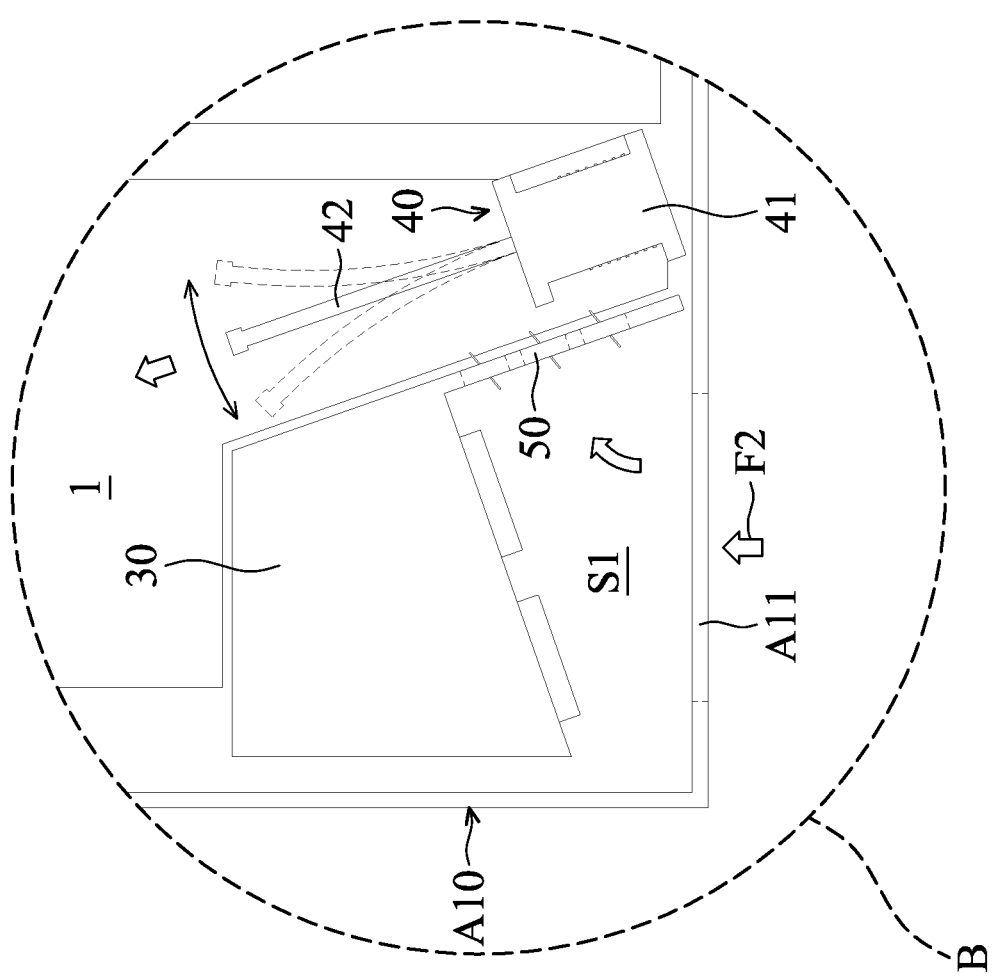
FIG. 6 is an enlarged view of part B of FIG. 3.

FIG. 6 is an enlarged view of part B of FIG. 3. In a second case, the housing A10 has an acoustic hole A11, and the portable electrical device 1 further includes a loudspeaker 30, a fan 40 and a gate 50. The loudspeaker 30 is disposed in the housing A10, adjacent to the acoustic hole A11. The fan 40 is disposed in the housing A10, adjacent to the acoustic hole A11.

The fan 40 includes a piezoelectric element 41 and a blade 42 disposed on the piezoelectric element 41. The fan 40 may be a piezoelectric Fan, and the structure of the fan 40 is the same as the fan 20. The gate 50 is connected with the loudspeaker 30 and the housing A10, and located between the acoustic hole A11 and the fan 40. The blade 42 is substantially parallel to the gate 50.

Figure 7:
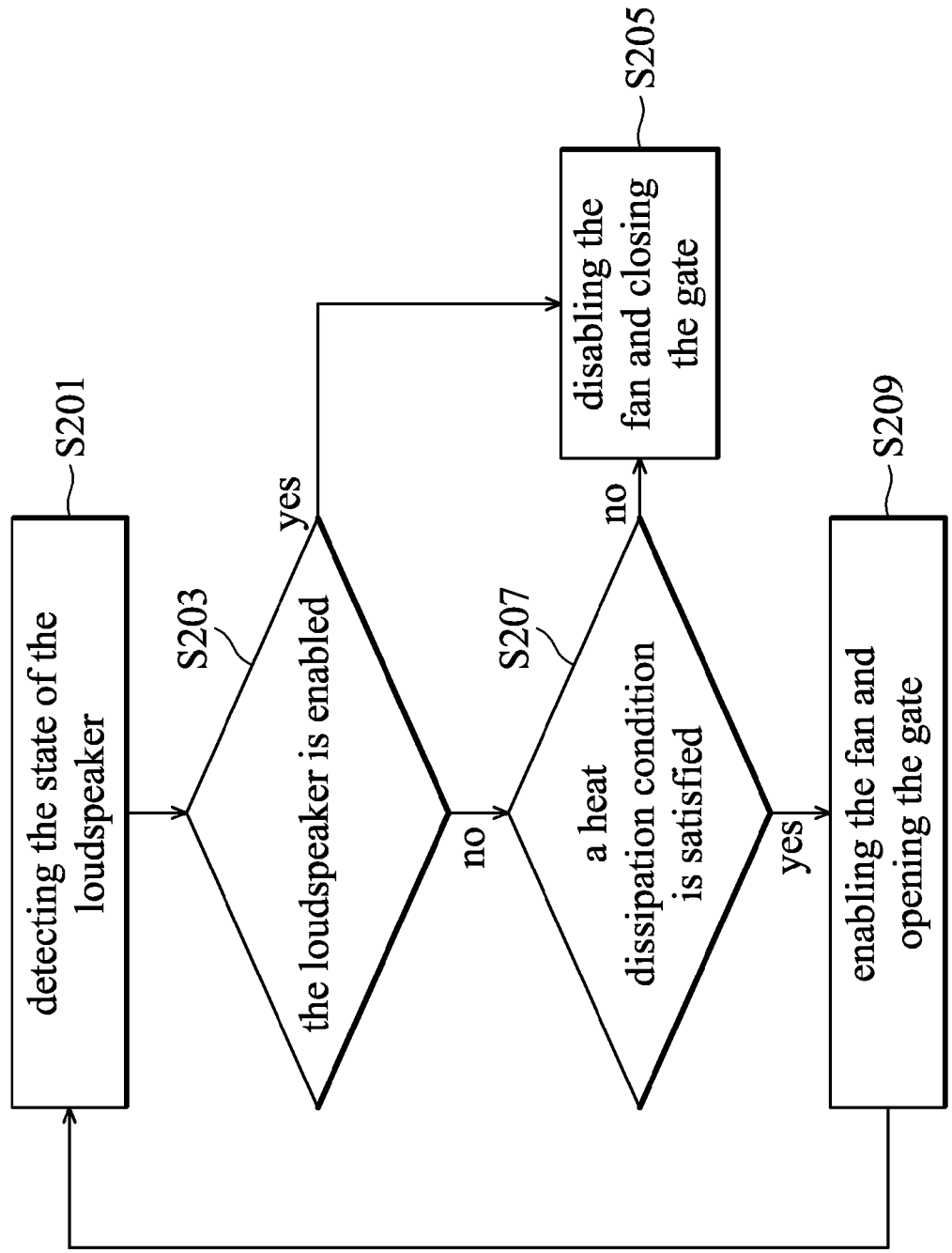
FIG. 7 is a flow chart of a heat dissipation method of the portable electrical device of a second case according to the present disclosure.

FIG. 7 is a flow chart of a heat dissipation method of the portable electrical device 1 of a second case according to the present disclosure. When the heat dissipation method of the second case is processed, the state of the loudspeaker 30 may be detected (step S201) to determine whether the loudspeaker 30 is enabled. Namely, whether the loudspeaker 30 receives a sound signal to generate sound is determined (step S203). When the loudspeaker 30 is enabled, the fan 40 is disabled, and the gate 50 is closed (step S205). Further, a chamber S1 is formed between the loudspeaker 30, the housing A10 and the gate 50 due to the gate 50 being closed. The chamber S1 helps the sound generated by the loudspeaker 30 transmitted to the outside of the housing A10 via the acoustic hole A11.

When the loudspeaker 30 is disabled, whether a heat dissipation condition is satisfied is determined (step S207). When the heat dissipation condition is not satisfied, the fan 40 is disabled and the gate 50 is closed (step S205). When the heat dissipation condition is satisfied, the fan 40 is enabled and the gate 50 is opened (step S209). In step S207, since the fan 40 is enabled and the gate 50 is opened, the fan 40 generates an airflow F2, which flows into the chamber S1 via the acoustic hole A11, and flows to the blade 42 via the gate 50.

In the first and second cases, since the fans 20 and 40 of a small size are disposed in the housing A10, the airflows F1 and F2 are formed to dissipate heat. Further, the airflows F1 and F2 flow into the housing A10 via the earphone hole 11 and the acoustic hole A11 for dissipating the heat of the electronic element A30. Since the earphone hole 11 and the acoustic hole A11 have already existed on the housing A10, additional heat-dissipation holes are not needed in the housing A10 and thus, the appearance of the housing A10 is not influenced.

Figure 8:
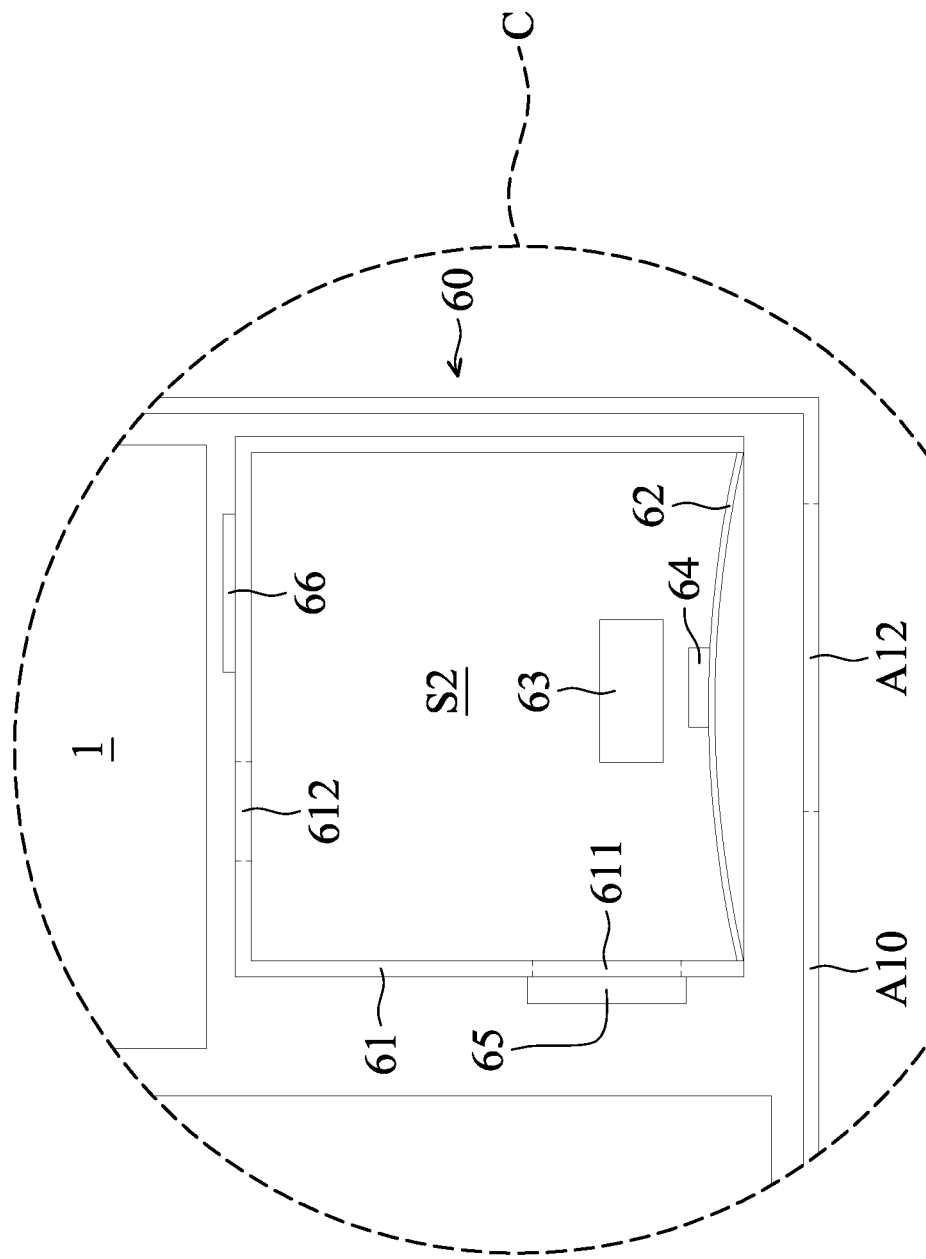
FIG. 8 is an enlarged view of part C of FIG. 3.

FIG. 8 is an enlarged view of part C of FIG. 3. The housing A10 has an acoustic hole A12. The portable electrical device 1 includes a loudspeaker 60 disposed in the housing A10, adjacent to the acoustic hole A12. The loudspeaker 60 includes an acoustic casing 61, a vibrating membrane 62, a first magnetic element 63, a second magnetic element 64, a first baffle 65, and a second baffle 66. The acoustic casing 61 is disposed in the housing A10. The vibrating membrane 62 is disposed on the acoustic casing 61 and faces the acoustic hole A12.

The first magnetic element 63 is fixed in the acoustic casing 61. The second magnetic element 64 is fixed on a central area of the vibrating membrane 62, and faces the first magnetic element 63. By changing the magnetic poles of the first magnetic element 63, a magnetic attractive force or a magnetic repulsive force between the first magnetic element 63 and the second magnetic element 64 is generated to vibrate the vibrating membrane 62.

In this case, the acoustic casing 61 is disposed in the housing A10, and has an inlet aperture 611, an exhaust aperture 612, and a chamber S2. The chamber S2 communicates with the inlet aperture 611 and the exhaust aperture 612. The first baffle 65 is movably disposed on the acoustic casing 61, and alternatively covers the inlet aperture 611. The second baffle 66 is movably disposed on the acoustic casing 61, and alternatively covers the exhaust aperture 612.

Figure 9:
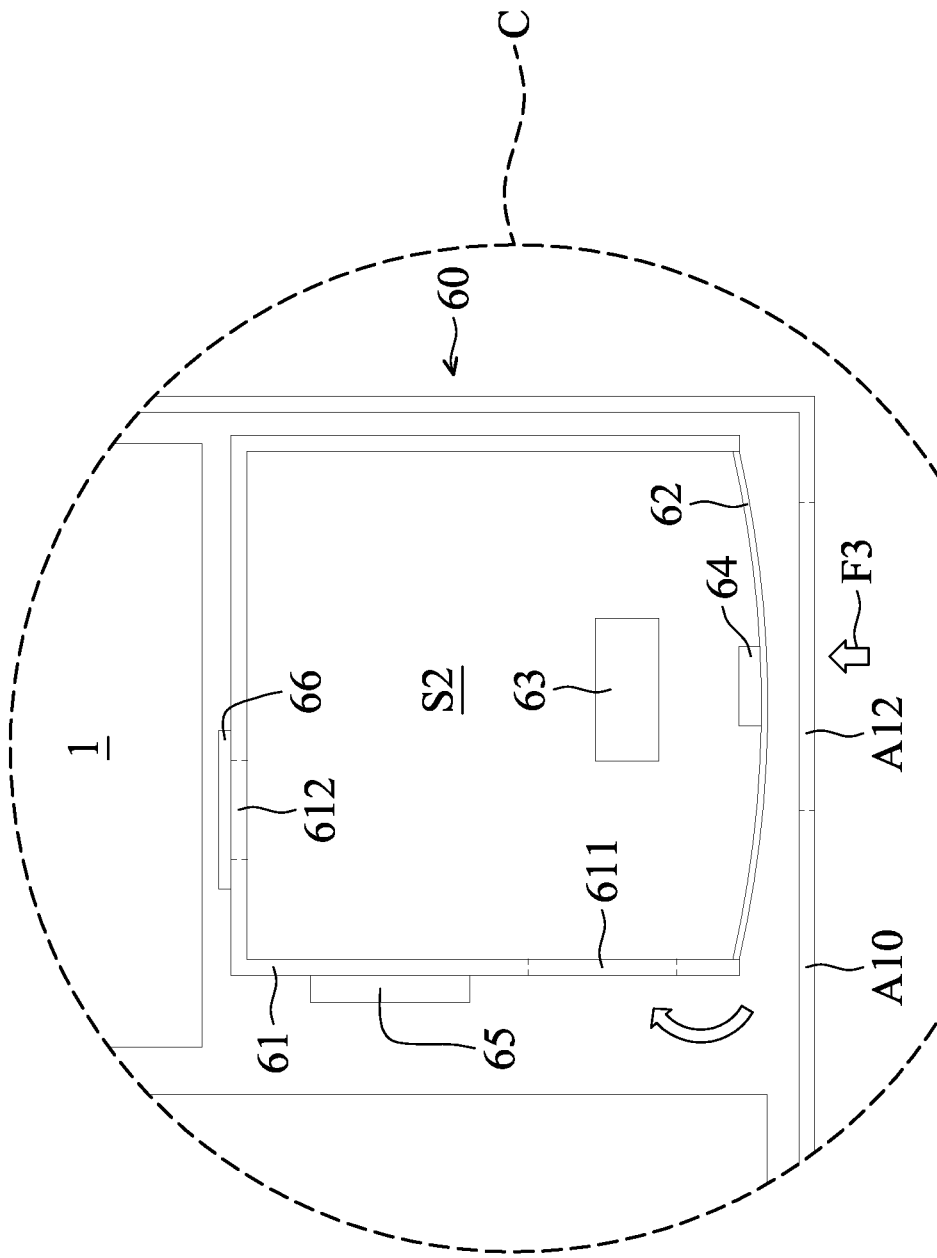
FIG. 9 is a schematic view of a loudspeaker during a heat dissipation process according to the present disclosure.
Figure 10:
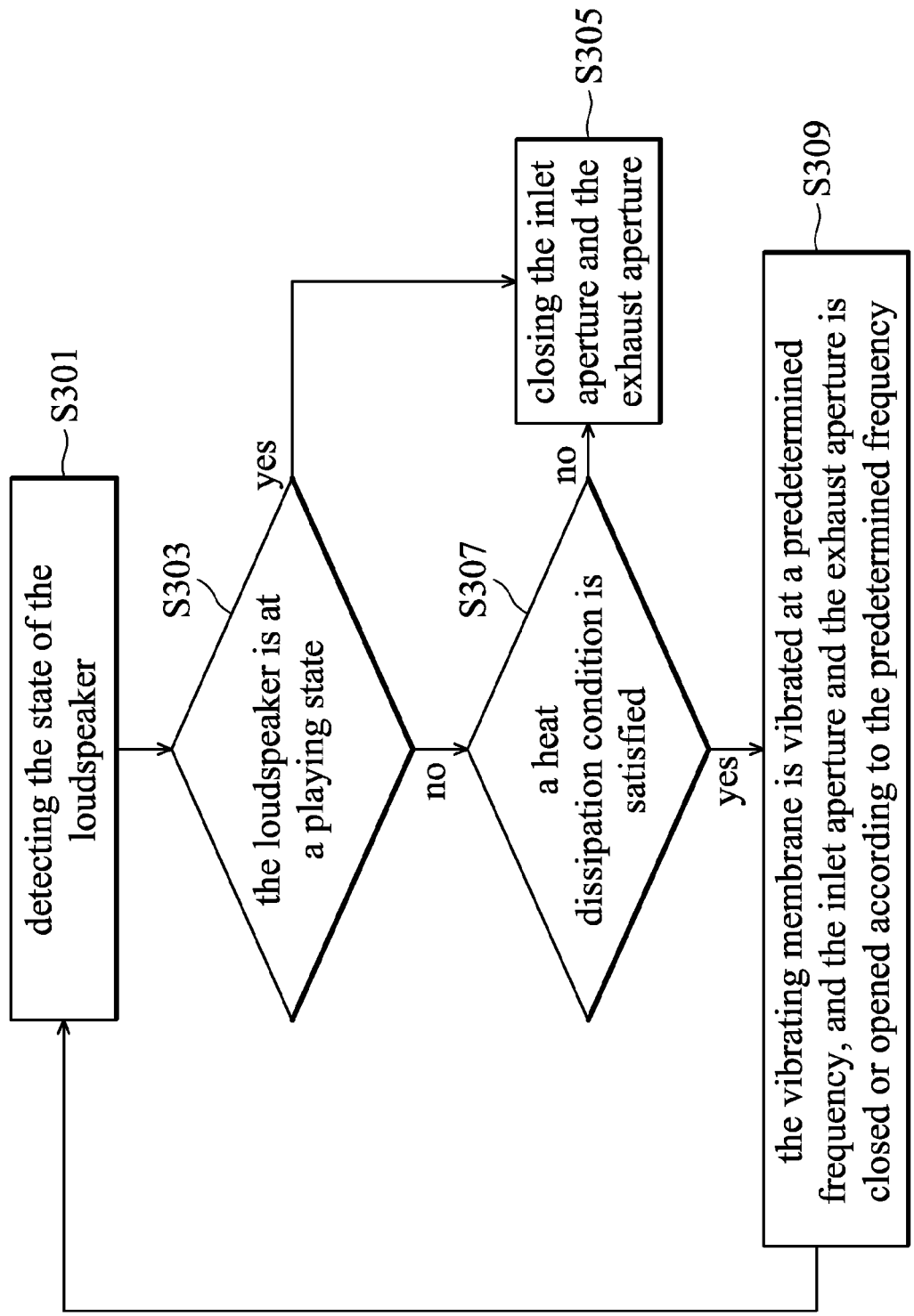
FIG. 10 is a flow chart of a heat dissipation method of the portable electrical device of a third case according to the present disclosure.

FIG. 9 is a schematic view of a loudspeaker 60 during a heat dissipation process according to the present disclosure. FIG. 10 is a flow chart of a heat dissipation method of the portable electrical device 1 of a third case according to the present disclosure. When the heat dissipation method of the third case is processed, the state of the loudspeaker 60 is detected (step S301) to determine whether the loudspeaker 60 is in a playing state (step S303). In the playing state, the loudspeaker 60 receives a sound signal, and plays sound according to the sound signal.

If the loudspeaker 60 is in a playing state, the inlet aperture 611 and the exhaust aperture 612 are closed by the first baffle 65 and the second baffle 66 (step S305). If the loudspeaker 60 is not in a playing state, whether the loudspeaker 60 is satisfied with a heat dissipation condition is determined (step S307). When the loudspeaker 60 is not satisfied with the heat dissipation condition, the inlet aperture 611 and the exhaust aperture 612 are closed (step S305).

When the heat dissipation condition is satisfied, and the loudspeaker 60 is not in the playing state, step S309 is processed. In step S309, the vibrating membrane 62 is vibrated at a predetermined frequency. For example, the predetermined frequency is about 30 Hz. As shown in FIG. 9, the loudspeaker 60 is in the inlet state, the central area of the vibrating membrane 62 is moved toward the acoustic hole A12. Further, the inlet aperture 611 is opened, and the exhaust aperture 612 is closed. The chamber S2 in the acoustic casing 61 has negative pressure due to the impulsive force of the vibrating membrane 62, and therefore, an airflow F3 is generated. The airflow F3 flows into the housing A10 via an acoustic hole A12, and flows into the chamber S2 via the inlet aperture 611.

As shown in FIG. 8, the loudspeaker 60 is in an exhaust state, and the central area of the vibrating membrane 62 is moved away from the acoustic hole A12. Further, the inlet aperture 611 is closed, and the exhaust aperture 612 is opened. Therefore, the chamber S2 in the acoustic casing 61 has positive pressure due to the impulsive force of the vibrating membrane 62, and a portion of the air in the chamber S2 flows out of the chamber S2 via the exhaust aperture 612 to dissipate the heat of the electronic element A30. By the vibration of the vibrating membrane 62, and the inlet aperture 611 and the exhaust aperture 612 being opened and closed according to the vibration, the inlet state and the exhaust state of the loudspeaker 60 is alternately changed to make the airflow F3 flow into the housing A10.

Therefore, in this case, the portable electrical device 1 generates the airflow F3 by the existing loudspeaker 60, and the airflow F3 flows into the housing A10 via the existing acoustic hole A13. The size of the heat dissipation mechanism is even smaller, and the appearance of the housing A10 is not influenced.

In conclusion, the portable electrical device having a heat dissipation mechanism of the present disclosure generates an airflow passing through the acoustic hole and/or the earphone hole by a smaller piezoelectric Fan and/or the vibrating membrane of the loudspeaker to dissipate the heat therein. Moreover, since the portable electrical device dissipates heat via the holes already existing on the housing, additional holes for dissipating heat are not needed.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A portable electrical device having a heat dissipation mechanism, comprising:
    a housing;
    an earphone receptacle, disposed in the housing, having an earphone hole; and
    a first fan, disposed in the housing, adjacent to the earphone hole;
    wherein when a heat dissipation condition is satisfied and an earphone terminal is not inserted in the earphone receptacle, the first fan is enabled to generate a first airflow passing through the earphone hole.

2. The portable electrical device as claimed in claim 1, wherein the first fan is a piezoelectric fan.

3. The portable electrical device as claimed in claim 1, wherein the housing has a first acoustic hole, and the portable electrical device comprises:
    a first loudspeaker, disposed in the housing, adjacent to the first acoustic hole; and
    a second fan, disposed in the housing, adjacent to the first acoustic hole,
    wherein when the heat dissipation condition is satisfied and the first loudspeaker is disabled, the second fan is enabled and generates a second airflow passing through the first acoustic hole.

4. The portable electrical device as claimed in claim 3, wherein the second fan is a piezoelectric fan.

5. The portable electrical device as claimed in claim 3, further comprising:
    a gate connected with the first loudspeaker and the housing, and located between the first acoustic hole and the second fan,
    wherein when the second fan is enabled, the gate is opened, and when the second fan is disabled, the gate is closed.

6. The portable electrical device as claimed in claim 1, further comprising a temperature sensing module disposed in the housing, wherein the heat dissipation condition is defined as a temperature detected by the temperature sensing module being greater than a predetermined temperature.

7. The portable electrical device as claimed in claim 1, comprising a second loudspeaker, and the housing has a second acoustic hole adjacent to the second loudspeaker.

8. The portable electrical device as claimed in claim 7, wherein the second loudspeaker comprises:
    an acoustic casing, disposed in the housing, having an inlet aperture, an exhaust aperture, and a chamber, wherein the chamber communicates with the inlet aperture and the exhaust aperture; and
    a vibrating membrane, disposed in the acoustic casing, facing the acoustic hole;
    wherein when the heat dissipation condition is satisfied and a central area of the vibrating membrane is moved toward the acoustic hole, the inlet aperture is opened, the exhaust aperture is closed, and an airflow flows into the chamber via the acoustic hole and the inlet aperture,
    wherein when the heat dissipation condition is satisfied and the central area of the vibrating membrane is moved away from the acoustic hole, the inlet aperture is closed, the exhaust aperture is opened, and a portion of the air in the chamber flows out of the chamber via the exhaust aperture.

9. A portable electrical device having a heat dissipation mechanism, comprising:
    a housing having an acoustic hole;
    a loudspeaker, disposed in the housing, adjacent to the acoustic hole; and
    a fan, disposed in the housing, adjacent to the acoustic hole;
    wherein when a heat dissipation condition is satisfied and the loudspeaker is disabled, the fan is enabled to generate an airflow passing through the acoustic hole.

10. The portable electrical device as claimed in claim 9, wherein the fan is a piezoelectric fan.

11. The portable electrical device as claimed in claim 9, further comprising:
    a gate connected with the loudspeaker and the housing, and located between the acoustic hole and the second fan,
    wherein when the second fan is enabled, the gate is opened, and when the second fan is disabled, the gate is closed.

12. The portable electrical device as claimed in claim 9, further comprising a temperature sensing module disposed in the housing, wherein the heat dissipation condition is defined as a temperature detected by the temperature sensing module being greater than a predetermined temperature.

13. A portable electrical device having a heat dissipation mechanism, comprising:
  a housing having an acoustic hole; and
  a loudspeaker adjacent to the acoustic hole, comprising:
    an acoustic casing, disposed in the housing, having an inlet aperture, an exhaust aperture, and a chamber, wherein the chamber communicates with the inlet aperture and the exhaust aperture; and
    a vibrating membrane, disposed in the acoustic casing, facing the acoustic hole;
    wherein when a heat dissipation condition is satisfied, and a central area of the vibrating membrane is moved toward the acoustic hole, the inlet aperture is opened, the exhaust aperture is closed, an airflow flows into the chamber is via the acoustic hole and the inlet aperture,
    wherein when the heat dissipation condition is satisfied and the central area of the vibrating membrane is moved away from the acoustic hole, the inlet aperture is closed, the exhaust aperture is opened, and a portion of the air in the chamber flows out of the chamber via the exhaust aperture.

14. The portable electrical device as claimed in claim 13, further comprising a temperature sensing module disposed in the housing, wherein the heat dissipation condition is defined as a temperature detected by the temperature sensing module being greater than a predetermined temperature, and a sound signal is not received by the loudspeaker.

15. The portable electrical device as claimed in claim 13, wherein the heat dissipation condition is satisfied, the vibrating membrane is vibrated at a predetermined frequency.

16. The portable electrical device as claimed in claim 15, wherein the predetermined frequency is about 30 Hz.

17. The portable electrical device as claimed in claim 13, wherein the loudspeaker further comprises:
  a first baffle, disposed on acoustic casing, and alternatively covering the inlet aperture; and
  a second baffle, disposed on the acoustic casing, and alternatively covering the exhaust aperture.

* * * * *